(12) United States Patent
Bhattacharyya

(10) Patent No.: US 7,378,707 B2
(45) Date of Patent: May 27, 2008

(54) SCALABLE HIGH DENSITY NON-VOLATILE MEMORY CELLS IN A CONTACTLESS MEMORY ARRAY

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 11/138,527

(22) Filed: May 26, 2005

(65) Prior Publication Data

US 2006/0267072 A1 Nov. 30, 2006

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .............. 257/328; 257/329; 257/330; 257/331; 257/332; 257/333; 257/334; 257/623; 624/625; 624/626; 624/905

(58) Field of Classification Search ........ 257/328–334, 257/623–626, 905
See application file for complete search history.

(56) References Cited

U.S. PATENT DOCUMENTS

| | | | | |
|---|---|---|---|---|
| 6,710,404 B2* | 3/2004 | Lee | | 257/330 |
| 6,717,200 B1* | 4/2004 | Schamberger et al. | | 257/302 |
| 6,781,197 B2* | 8/2004 | Fujishima et al. | | 257/329 |
| 7,075,146 B2* | 7/2006 | Forbes | | 257/330 |
| 7,109,551 B2* | 9/2006 | Sugi et al. | | 257/330 |
| 7,148,538 B2* | 12/2006 | Forbes | | 257/316 |
| 7,241,654 B2* | 7/2007 | Forbes | | 438/209 |
| 2002/0175365 A1* | 11/2002 | Hirayama | | 257/329 |
| 2004/0202032 A1* | 10/2004 | Forbes | | 365/200 |
| 2005/0001264 A1* | 1/2005 | Ono et al. | | 257/330 |
| 2005/0285175 A1* | 12/2005 | Cheng et al. | | 257/302 |
| 2006/0013042 A1* | 1/2006 | Forbes et al. | | 365/185.08 |
| 2006/0220093 A1* | 10/2006 | Van Schaijk et al. | | 257/315 |

OTHER PUBLICATIONS

H. Kotaki, *70nm High-Performance 2 bit/cell Nonvolatile Memory with Oxide/Nitride/Oxide Sidewalls*, Sharp Corporation, Nara, Japan, 2003, 3 pgs.
T. Ishimaru et al., *Impact of SiON on Embedded Nonvolatile MNOS Memory*, Hitachi, Ltd., Renesas Technology Corp., Tokyo, Japan, 2004, 3 pgs.

* cited by examiner

*Primary Examiner*—Ida M. Soward
(74) *Attorney, Agent, or Firm*—Leffert Jay & Polglaze, P.A.

(57) ABSTRACT

A plurality of mesas are formed in the substrate. Each pair of mesas forms a trench. A plurality of diffusion areas are formed in the substrate. A mesa diffusion area is formed in each mesa top and a trench diffusion area is formed under each trench. A vertical, non-volatile memory cell is formed on each sidewall of the trench. Each memory cell includes a fixed threshold element located vertically between a pair of non-volatile gate insulator stacks. In one embodiment, each gate insulator stack includes a tunnel insulator formed over the sidewall, a deep trapping layer, and a charge blocking layer. In another embodiment, an injector silicon rich nitride layer is formed between the deep trapping layer and the charge blocking layer.

21 Claims, 5 Drawing Sheets

SCALABLE HIGH DENSITY NON-VOLATILE MEMORY CELLS IN A CONTACTLESS MEMORY ARRAY

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), synchronous dynamic random access memory (SDRAM), dynamic random access memory (DRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As computers become smaller and their performance increases, the computer memories have also gone through a corresponding size reduction and performance increase. However, flash memory devices present a challenge in scalability due, at least in part, to the high programming voltages typically required. Additionally, due to required real estate for contacts and other memory circuitry, the density of a memory device is also limited.

For the reasons stated above, and for other reasons stated below which will become apparent to those skilled in the art upon reading and understanding the present specification, there is a need in the art for a more scalable, higher density non-volatile memory device.

SUMMARY

The above-mentioned problems with scalable memory and other problems are addressed by the present invention and will be understood by reading and studying the following specification.

The embodiments of the present invention encompass a non-volatile memory device. The device comprises a plurality of mesas in the substrate that form a trench between them. A plurality of diffusion areas are formed in the substrate. A mesa diffusion area is formed in each mesa top and a trench diffusion area is formed under each trench. A vertical, non-volatile memory cell is formed on each sidewall of the trench. Each memory cell is comprised of a fixed threshold element located vertically between a pair of non-volatile elements with associated gate insulator stacks.

In one embodiment, each gate insulator stack of the non-volatile elements is comprised of a tunnel insulator formed over the sidewall, a deep trapping layer, and a charge blocking layer. In another embodiment, an injector silicon rich nitride layer is incorporated between the deep trapping layer and the charge blocking layer. The trapping layer may be SiON of appropriate composition to provide a high-density deep trapping layer.

Further embodiments of the invention include methods and apparatus of varying scope.

DETAILED DESCRIPTION

Figure 1:
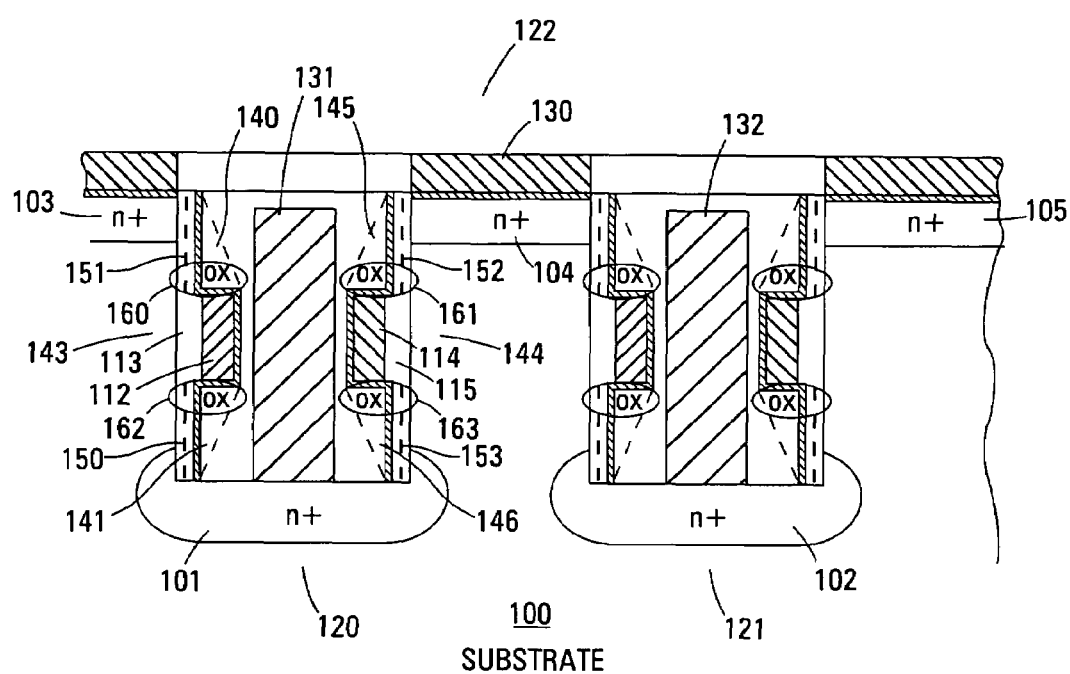
FIG. 1 shows a cross-sectional view of one embodiment of a two element non-volatile memory cell of the present invention with a fixed threshold element.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

FIG. 1 illustrates a cross-sectional view of one embodiment of the two bistable element, non-volatile memory cells of the present invention with a fixed threshold element. Each vertical cell is substantially similar. Therefore, for purposes of clarity, only the cells of one trench will be discussed in detail.

The cells are fabricated in trenches 120, 121 that are formed in a substrate 100. In one embodiment, the substrate 100 is a lightly doped p-type silicon. In an alternate embodiment, the substrate 100 is a lightly doped n-type silicon. A mesa 122 is formed between each pair of trenches 120, 121.

Heavily doped diffusion areas 101-105 are created in the substrate 100. If the substrate is a p-type material, the diffusion areas 101-105 are of n+ conductivity. However, an alternate embodiment could use an n-type substrate thus requiring p+ type diffusion areas 101-105.

The lower diffusion areas 101, 102 are formed in the substrate below the trench. This area serves to serially link the two non-volatile memory cells within a trench. Doped polysilicon studs 131, 132 act as contact electrodes to diffusion areas 101, 102, respectively. Metal contacts to the polysilicon studs 131, 132 are made outside the array, thereby improving bit density.

The upper diffusion areas 103-105 are formed in the tops of the mesas between the trenches. These areas 103-105 are linking diffusion areas that serially link the non-volatile cells in each trench. This forms a NAND memory structure such as the serial columns illustrated in FIG. 5 and discussed subsequently. For a NAND configuration within a string, no direct contacts are required for 103-105.

Channel regions 143, 144 are formed in the substrate 106 between the lower diffusion area 101 and the upper diffusion areas 103 and 104 respectively. These are the regions 143, 144 in which the channels form, as is well known in the art, during operation of the memory cells. The buried diffusion areas 101, 102 are contacted by the doped polysilicon stud-lines 131 and 132 respectively. The function of these buried diffusion lines depend on the array configurations and the direction of operation of a specific memory device or an array chain. The buried diffusion lines may be contacted as common source line or drain line for the desired memory configuration or to establish a link between devices in a serial string.

Each sidewall of the trench comprises a vertical, non-volatile memory cell with two bi-stable gate insulator stacks and a fixed threshold element for controlling the channel region of the cell. The fixed threshold element comprises a control gate 112, 114 that is formed over an oxide or oxynitride insulator 113, 115. The channel length of the fixed threshold element is long enough to minimize short channel effect and device leakage. Each control gate 112, 114 is connected to adjacent control gates to form a continuous word line that extends into the page of FIG. 1. In one embodiment, the control gate 112, 114 is comprised of a polysilicon material. Alternate embodiments use other materials. Control gates 112, 114 remain embedded within an array requiring no contact within the array, thereby improving bit density.

Each cell also has two non-volatile elements comprised of gate insulator stacks 150-153, each storing a charge. Since each insulator stack 150-153 is capable of storing a separate charge density, each vertical cell can hold two bits of data. Each of the gate insulator stacks 150-153 are substantially similar and are discussed in greater detail with reference to the embodiments of FIGS. 2 and 3.

An oxide area 140, 141, 145, 146 is located above each gate insulator stack 150-153. The oxide area 140, 141, 145, 146, in one embodiment, this oxide area is comprised of the same oxide that insulates the remainder of the trench. Alternate embodiments can use other materials in this area 140, 141, 145, 146.

Figure 4:
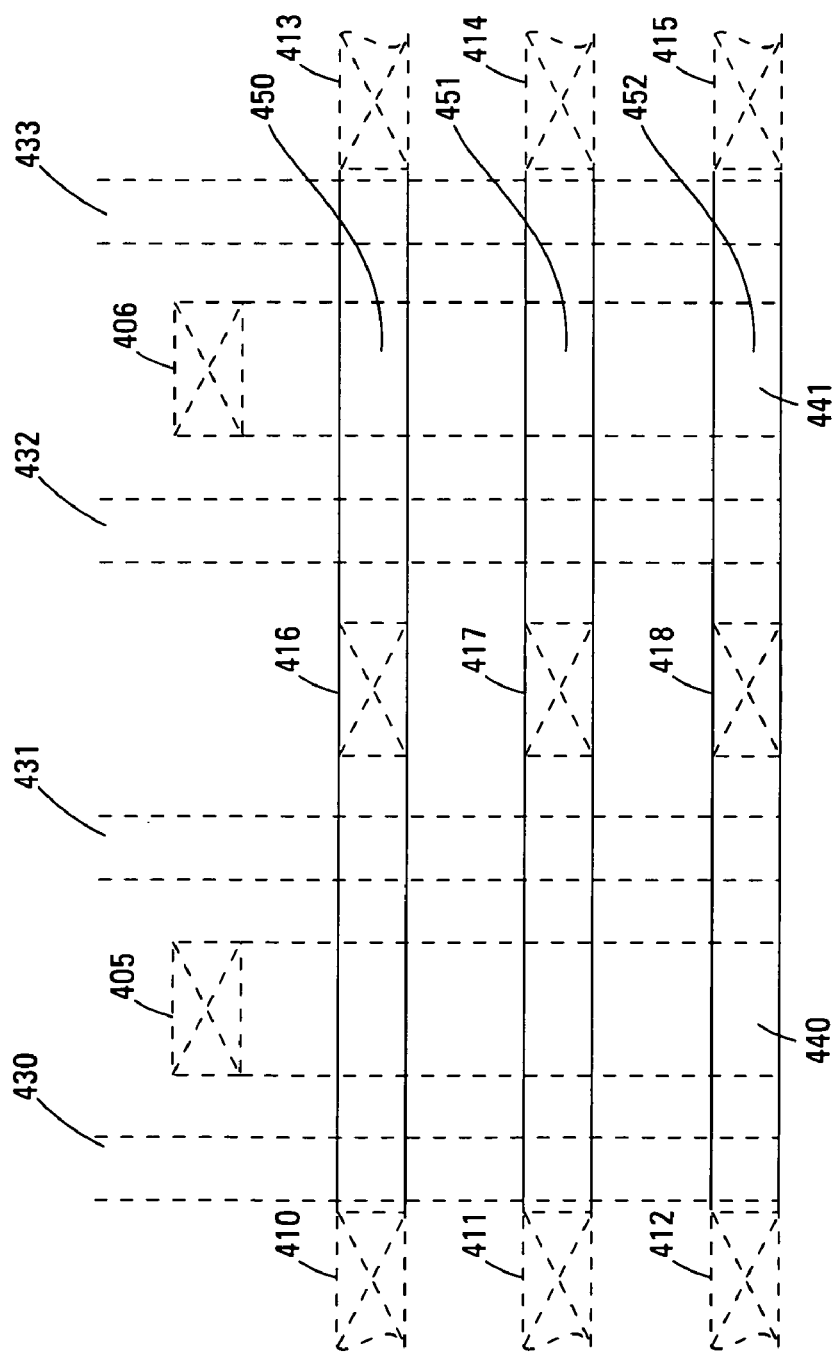
FIG. 4 shows a top layout view of an array using the two element non-volatile memory cell of the present invention with the fixed threshold element and contact scheme.

A self-aligned local interconnect (SALI) area 130 is a metal layer that may or may not selectively establish Ohmic contact 103-105 to the diffusion area underneath. In one embodiment, as shown in FIGS. 1 and 4, it may serve as a common layer to connect all of the top diffusion areas together to form a NAND string. The ends of each serial string bit line and word line may be contacted so that the array is a contact-less array, except for the end connections. In one embodiment, the buried diffusions 101, 102, through the contact electrodes 131, 132 share the diffusion nodes between the two adjacent memory cells. Metal contacts to electrodes 131 or 132 may be made outside the array (see FIG. 4) thus enhancing bit density.

While the above-described embodiment is discussed as a NAND array. The present invention is not limited to such an architecture. Alternate embodiments can be used in NOR arrays, AND arrays, direct tunnel memory for DRAM devices, virtual gate arrays, and other types of memory architectures using appropriate interconnect schemes.

The non-volatile memory cell string can be operated in either direction in order to store data in both gate insulator stack areas. For example, in one embodiment, if the left most diffusion area 103 is biased as a drain area and the buried diffusion areas are source areas, electrons are injected from the substrate 100 and stored in the trapping layer of one of the gate insulator stacks 151, 152 in one of the trapping/detrapping regions 160, 161. If the bias conditions are reversed such that the left most diffusion area 103 or 104 is a source area, the electrons are injected from the substrate 100 and stored in the trapping/detrapping regions 162, 163 of the opposite gate insulator stacks 150, 153 of the cells.

In one embodiment, the tunnel layer 200 could be $SiO_2$, oxygen-rich SiON (refractive index: 1.5-1.6, atomic concentration ratio or a combination of $Si:N:O=1:\leqq 0.5:\geqq 1.3$), $SiO_2+SiON$, or some appropriate tunnel layer of nearly trap-free low, leakage insulator.

Figure 2:
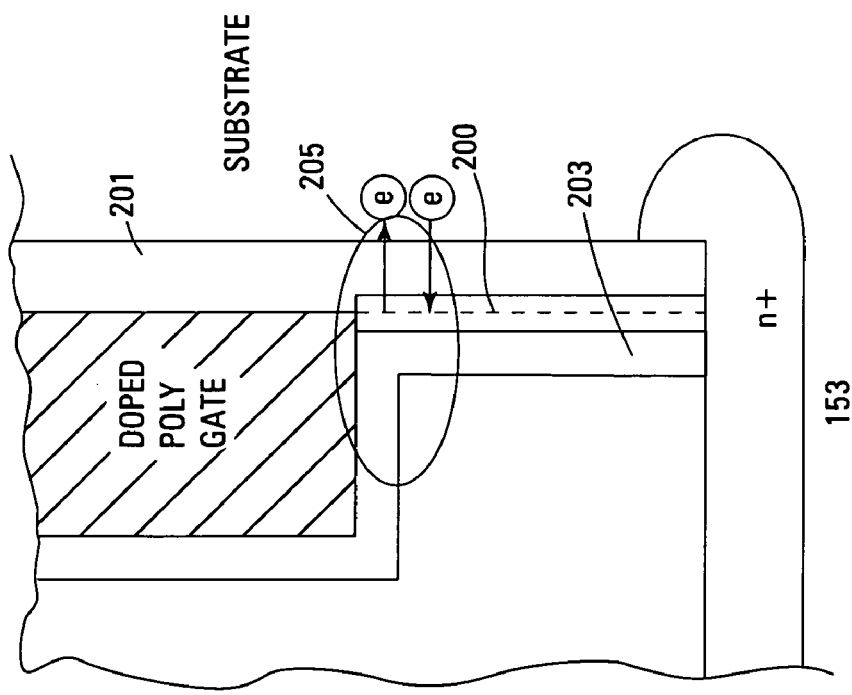
FIG. 2 shows a cross-sectional view of one embodiment of a trapping layer insulator stack of the present invention, adjacent to the fixed threshold element.

FIG. 2 illustrates a cross-sectional view of one embodiment of a gate insulator stack 153 for each bi-stable element of a non-volatile memory cell of the present invention, as discussed above with reference to FIG. 1. This architecture employs an embedded trapping layer for storing a charge in the trapping/detrapping region 205.

The stack 153 is comprised of a tunnel insulator 201, a trapping layer 200, and a charge blocking layer 203. The deep energy trapping layer 200, in one embodiment, is comprised of an oxynitride SiON (refractive index≈1.8 and atomic concentration ratios of $Si:N:O\approx 1:\geqq 1:\leqq 0.6$) or some other charge retention material with high density, deep energy traps. The deep trap SiON exhibits superior back-tunneling characteristics than a nitride material in order to prevent a charge from leaking back to the substrate.

The high-k insulating, charge blocking layer 203 is formed over the charge trapping layer 200. This layer 203 minimizes the programming voltage and field across the dielectric stack.

The blocking layer 203 is a high-K, high band gap dielectric medium that is characterized by a large energy barrier for electrons and holes. This provides a negligible field emission either from the trapping layer 200 or from the metal control gate. This layer 203 may be comprised of alumina ($Al_2O_3$) having a K=10, hafnia ($HfO_2$) or Zirconia ($ZrO_2$) with a K=20, or Praeseodymium Oxide ($Pr_2O_3$) with a K=30. Alternate embodiments using high-K materials can also be used.

A typical thickness for the blocking layer 203 might be 2 times to 10 times the thickness of the tunnel insulator. The actual thickness depends on the design point of the programming voltage and the high threshold target of the bistable element. The physical thickness could vary between 5 and 25 nm. Alternate embodiments can use other thickness ranges.

Figure 3:
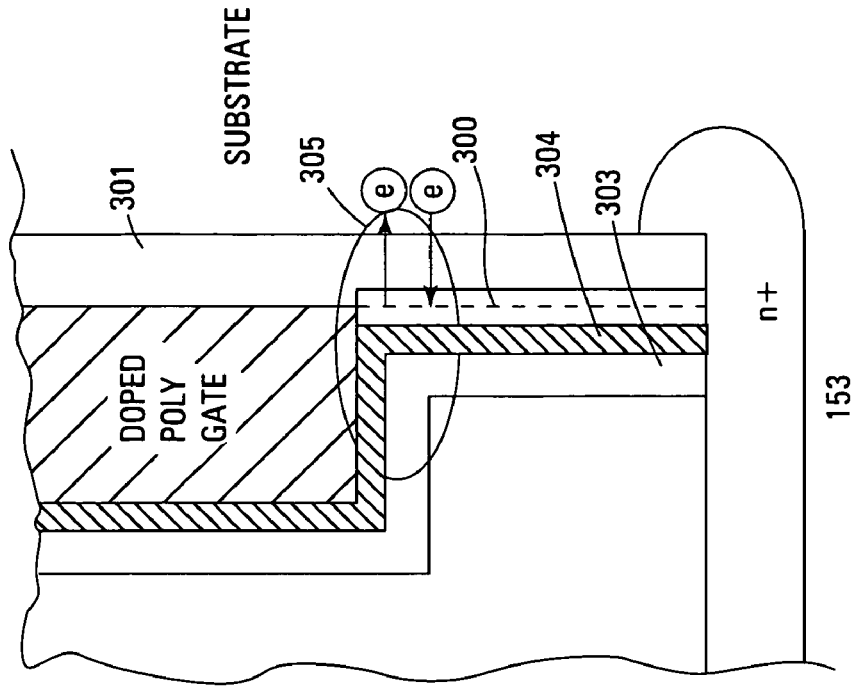
FIG. 3 shows a cross-sectional view of yet another embodiment of a trapping layer insulator stack of the present invention, adjacent to the fixed threshold element.

FIG. 3 illustrates a cross-sectional view of an alternate embodiment of a gate insulator stack 153 for each bi-stable element as illustrated in FIG. 1. The stack is comprised of a tunnel layer 301, a trapping layer 300, an injector layer 304, and a charge blocking layer 303. This embodiment utilizes an injector silicon rich nitride (SRN) layer to provide a faster erase operation using enhanced Fowler-Nordheim tunneling. The presence of the SRN layer aids in detrapping electrons from the trapping/detrapping region 305 in the trapping layer back to the silicon substrate during erase operations (negative voltage at the control gate).

A tunnel insulator layer 301 is formed over the substrate substantially similar to the one discussed with reference to FIG. 2. In one embodiment, the tunnel insulator 301 is formed from an oxygen rich oxynitride, SiON (refractive index≈1.5-1.6). The above SiON provides good back-tunneling characteristics in order to prevent a charge from leaking back to the substrate during standby. Alternate embodiments may use other materials with trap-free, low leakage characteristics.

The tunnel insulator 301 can be formed over the substrate using an atomic layer deposition (ALD) technique to produce a thickness, in one embodiment, in the range of 2-5 nm, an effective oxide thickness (EOT) of 1-2.5 nm. The actual desired thickness depends on the power supply ($V_{DD}$) requirement. The 2-5 nm range is appropriate for a $V_{DD}$ of 1.0-2.5V. A thickness of less than 2.5 nm typically enables the element to operate in the direct tunneling regime. Alternate embodiments that use other power supply voltages would use different insulator thicknesses.

In one embodiment, the oxygen rich SiON tunnel insulator 301 is characterized to have a very low trap density of less than $1 \times 10^{11}$, an atomic concentration of nitrogen that is less than or equal to 20%, an atomic oxygen concentration of greater than or equal to 45%, and a refractive index of 1.50 to 1.60. The ratio of Si:N:O≈1:≦0.5:≧1.3 as state earlier. These numbers are for purposes of illustration only.

A deep trapping layer 300 is formed over the tunnel insulator 301. The trapping layer 300 has a high trap density such as the SiON of refractive index 1.8 as discussed previously. Alternatively, the above trapping layer 300 could be replaced by a high density of embedded metal nano-dots in a dielectric (e.g., $Al_2O_3$) or SiON. A typical thickness range for the trapping layer 300 or embedded nano-dot layer may range between 4 and 10 nm. However, alternate embodiments may have other materials and other thickness ranges.

The alternate trapping layer scheme (not shown in FIG. 3) is comprised of high-density metal nano-dots embedded into a high dielectric constant insulator material. The embedded metal nano-dots are used as a charge retention layer for the non-volatile memory element. Each metal dot acts as an isolated, one-dimensional, small floating gate. Therefore, even if a charge leakage path exists between one small floating gate and the substrate or the control gate, the remaining nano-dots in the film layer retain the charge.

In one embodiment, the density range of the metal nano-dots in the trapping layer 300 is in the range of $2 \times 10^{12}$ to $10 \times 10^{13}$ with typical dot sizes in the range of 1-5 nm and spaced greater than 3 nm apart in the high-K dielectric material. Alternate embodiments can use different densities, dot sizes, and spacing.

The metal nano-dot elements can include Platinum (Pt), Iridium (Ir), Gold (Au), Cobalt (Co), Tungsten (W) or some other metal that provides deep energy electron and hole traps. In one embodiment, the metal nano-dot layer is deposited by sputtering or evaporation at relatively low temperatures.

The injector (SRN) layer 304 is formed over the deep trapping layer 300. A charge blocking, high-K dielectric layer 303 is formed over the injector SRN layer 304. These layers 304, 303 enhance erase speed and reduce the erase voltage required during an erase operation as the electrons are removed from the trapping layer 300 to the substrate.

During programming, electrons are injected from the substrate and stored in the trapping layer 300. During the programming operation, the control gate is pulsed positive and at higher potential than the source line in order to facilitate electron transport from the vertical channel (143 or 144 of FIG. 1) to the floating trap layer 300. During an erase operation, the control gate potential is negative and electrons return to the substrate from the trapping layer.

FIG. 4 illustrates a top view of one embodiment of the array of the present invention. This view shows the various components of the non-volatile memory cells as discussed above.

The buried diffusion stud-lines (131 and 132 of FIG. 1) 440 and 441 respectively may be contacted at contacts 405 and 406 respectively outside the array region as shown in FIG. 4. These lines may also be contacted on the bottom side of the array (not shown). Contacts 405,406 are contact schemes only for illustration purposes and may or may not be actual contacts.

Metal bit lines 450-452 are shown with potential self-aligned local contact areas (SALC) 410-418. For a NAND configuration, a metal bit line may interconnect with such a contact at each end of the string (not shown). SALC areas 410-418 are not in actual direct contact with bit lines 450-452 but for illustration purposes depict location of self-aligned contacts which could be used for other array configurations. The buried word lines 430-433 are shown without contacts inside the array for purposes of clarity. However, it is well known in the art that at least one end of each word line 430-433 is contacted in order to provide proper biasing levels for memory operation.

Figure 5:
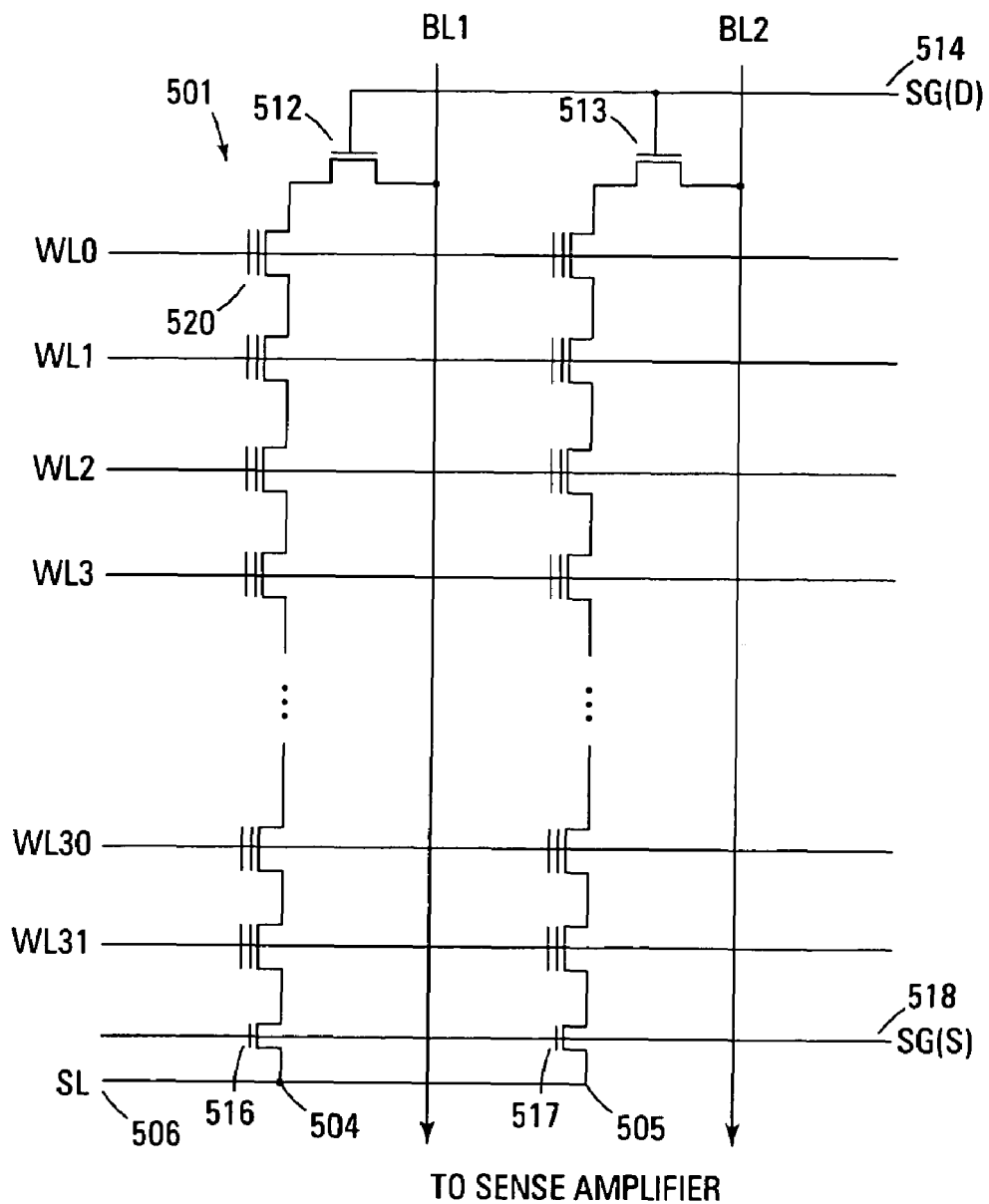
FIG. 5 shows a simplified diagram of one embodiment of a NAND flash memory array architecture of the present invention.

FIG. 5 illustrates a simplified diagram of one embodiment for a NAND flash memory array of the present invention. The memory array of FIG. 5, for purposes of clarity, does not show all of the elements typically required in a memory array. For example, only two bit lines are shown (BL1 and BL2) when the number of bit lines required actually depends upon the memory density. The bit lines are subsequently referred to as (BL1-BLN).

The array is comprised of an array of floating gate cells 501 arranged in series strings 504, 505. Each of the floating gate cells 501 are coupled drain to source in each series chain 504, 505. A word line (WL0-WL31) that spans across multiple series strings 504, 505 is coupled to the control gates of every floating gate cell in a row in order to control their operation. The bit lines (BL1-BLN) are eventually coupled to sense amplifiers (not shown) that detect the state of each cell.

In operation, the word lines (WL0-WL31) select the individual floating gate memory cells in the series chain 504, 505 to be written to or read from and operate the remaining floating gate memory cells in each series string 504, 505 in a pass through mode. Each series string 504, 505 of floating gate memory cells is coupled to a source line 506 by a source select gate 516, 517 and to an individual bit line (BL1-BLN) by a drain select gate 512, 513. The source select gates 516, 517 are controlled by a source select gate control line SG(S) 518 coupled to their control gates. The drain select gates 512, 513 are controlled by a drain select gate control line SG(D) 514.

Each cell can be programmed as a single bit per cell (SBC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell.

During a typical prior art programming operation, the selected word line for the flash memory cell to be programmed is biased with a programming pulse at a voltage that is greater than 16V. A verification operation with a word line voltage of 0V is then performed to determine if the floating gate is at the proper voltage (e.g., 0.5V). The unselected word lines for the remaining cells are typically biased at approximately 10V during the program operation. Each of the memory cells is programmed in a substantially similar fashion.

Figure 6:
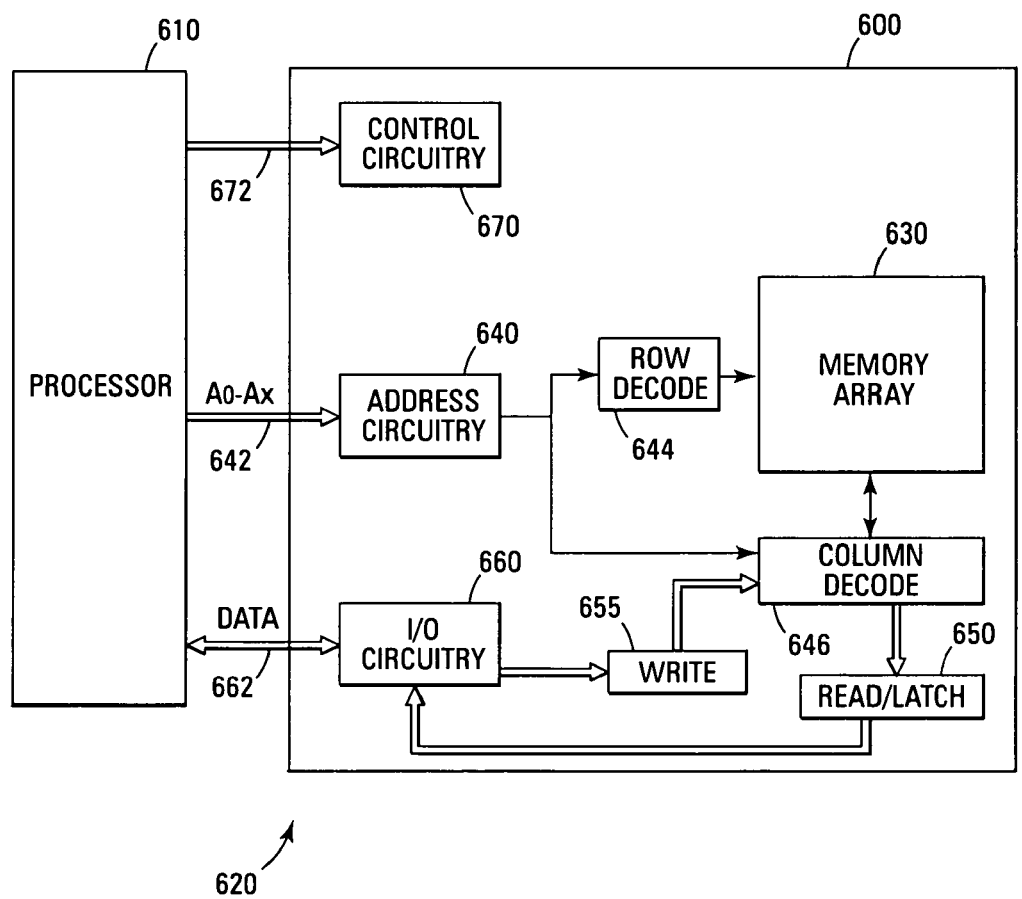
FIG. 6 shows a block diagram of one embodiment of an electronic system of the present invention.

FIG. 6 illustrates a functional block diagram of a memory device 600 that can incorporate the non-volatile memory cells of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of memory cells 630 that can be comprised of the planar-vertical, embedded trap, non-volatile memory cells previously illustrated. The memory array 630 is arranged in banks of rows and columns as illustrated in FIG. 5. The gates of each row of memory cells are coupled with a word line while the drain and source connections of the memory cells are coupled to bit lines.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write (program), and erase operations. The control circuitry 670 may be a state machine, a sequencer, or some other type of controller.

The memory device illustrated in FIG. 6 has been simplified to facilitate a basic understanding of the features of the memory. A more detailed understanding of internal circuitry and functions of memories are known to those skilled in the art.

CONCLUSION

The embodiments of the present invention provide a memory density of $6F^2$ for the four bits per trench. This works out to $1.5F^2$ per bit. This is accomplished by the hybrid vertical-planar structure with two gate insulator stacks that provide two bits per cell. The cell is controlled by the fixed threshold element between the two gate insulator stacks. The embedded trap cell's gate insulator stack design provides scalability, reliability, and power reduction as compared to prior art designs.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory device comprising:
   a plurality of trenches formed in a substrate, each pair of trenches defining a mesa;
   a plurality of diffusion areas formed in the substrate, a mesa diffusion area formed in each mesa top and a trench diffusion area formed under each trench; and
   a vertical non-volatile memory cell formed on each sidewall of the trench, each memory cell comprising a fixed threshold element located vertically between a pair of non-volatile gate insulator stacks wherein each non-volatile gate insulator stack comprises a tunnel insulator layer formed on the trench sidewall and adjacent to the trench diffusion area, a deep trapping layer formed over the tunnel insulator, and a charge blocking layer formed over the deep trapping layer.

2. The device of claim 1 wherein each mesa diffusion area is linked to adjacent trench diffusion areas by vertical channel regions in which a vertical channel forms during operation of the adjacent vertical non-volatile memory cell.

3. The device of claim 1 and further including self-aligned local interconnect areas formed over each mesa diffusion area.

4. The device of claim 1 wherein each non-volatile gate insulator stack further comprises:
   an injection silicon rich nitride layer formed between the deep trapping layer and the charge blocking layer.

5. The device of claim 1 wherein the fixed threshold element comprises a polysilicon control gate over an oxide layer.

6. The device of claim 1 wherein the trapping layer is a high dielectric constant material comprising embedded metal nano-dots.

7. The device of claim 1 wherein the charge blocking layer is comprised of one of: $Al_2O_3$, $HfO_2$, $ZrO_2$, or $PrO_3$.

8. The device of claim 1 wherein the deep trapping layer is one of silicon nano-crystals, a silicon rich insulator, or SiON.

9. The device of claim 6 wherein the embedded metal nano-dots comprise one of:
   platinum (Pt), gold (Au), Cobalt (Co), or Tungsten (W).

10. A non-volatile memory device comprising:
    a plurality of trenches formed in a substrate, each pair of trenches defining a mesa;
    a plurality of diffusion areas formed in the substrate, a mesa diffusion area formed in each mesa top and a source diffusion area formed under each trench;
    a buried diffusion line formed in each trench and coupled to the source diffusion area; and
    a pair of non-volatile memory cells formed vertically in each trench, each memory cell formed along a sidewall and comprising a control gate formed vertically over an oxide layer and located between a pair of vertical trapping layer insulator stacks.

11. The device of claim 10 wherein the substrate is a p-type substrate and the plurality of diffusion areas are n+.

12. The device of claim 10 wherein the substrate is an n-type substrate and the plurality of diffusion areas are p– conductivity areas.

13. The device of claim 10 wherein the trapping layer is comprised of SiON.

14. The device of claim 10 wherein the device is coupled in a NAND architecture.

15. The device of claim 10 wherein the diffusion areas serially link each memory cell of adjacent memory cells.

16. The device of claim 10 wherein the source line diffusion areas serially link each memory cell in each trench.

17. The device of claim 10 wherein the non-volatile memory device is part of a serial memory string that is part of a contact-less, non-volatile memory array.

18. A contact-less, non-volatile memory array comprising:
a plurality of trenches formed in a substrate, each pair of trenches defining a mesa;
a plurality of diffusion areas formed in the substrate, a mesa diffusion area formed in each mesa top and a source diffusion area formed under each trench;
a buried diffusion line formed in each trench and coupled to the source diffusion area; and
a pair of non-volatile memory cells formed vertically in each trench, each memory cell formed along a sidewall and comprising a control gate formed over an oxide layer and located between a pair of vertical trapping insulator stacks having a tunnel insulator layer, an SiON trapping layer, and a charge blocking layer.

19. The array of claim 18 wherein the tunnel insulator layer is comprised of an oxide material and the control gate is comprised of polysilicon.

20. The array of claim 18 wherein the vertical trapping insulator stacks further comprise an injector silicon rich nitride layer between the SiON trapping layer and the charge blocking layer comprising a high dielectric constant material.

21. An electronic system comprising:
a processor that generates memory signals; and
a flash memory device coupled to the processor and operating in response to the memory signals, the device having a memory array comprising:
a plurality of trenches formed in a substrate, each pair of trenches defining a mesa;
a plurality of diffusion areas formed in the substrate, a mesa diffusion area formed in each mesa top and a trench diffusion area formed under each trench; and
a vertical non-volatile memory cell formed on each sidewall of the trench, each memory cell comprising a fixed threshold element located vertically between a pair of non-volatile gate insulator stacks wherein each non-volatile gate insulator stack comprises a tunnel insulator layer formed on the trench sidewall and adjacent to the trench diffusion area, a deep trapping layer formed over the tunnel insulator, and a charge blocking layer formed over the deep trapping layer.

* * * * *